(12) United States Patent
Gallegos et al.

(10) Patent No.: US 8,298,874 B2
(45) Date of Patent: Oct. 30, 2012

(54) PACKAGED ELECTRONIC DEVICES HAVING DIE ATTACH REGIONS WITH SELECTIVE THIN DIELECTRIC LAYER

(75) Inventors: Bernardo Gallegos, The Colony, TX (US); Kenji Masumoto, Hayami-Gun (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/526,116

(22) Filed: Jun. 18, 2012

(65) Prior Publication Data

US 2012/0252170 A1   Oct. 4, 2012

Related U.S. Application Data

(62) Division of application No. 12/563,206, filed on Sep. 21, 2009, now Pat. No. 8,222,748.

(60) Provisional application No. 61/182,134, filed on May 29, 2009.

(51) Int. Cl.
*H01L 21/00* (2006.01)

(52) U.S. Cl. .................. 438/125; 257/E21.505; 438/108

(58) Field of Classification Search .................. 438/125, 438/108; 257/E21.505
See application file for complete search history.

(56) References Cited

U.S. PATENT DOCUMENTS

| | | | | |
|---|---|---|---|---|
| 5,739,585 | A  * | 4/1998 | Akram et al. | 257/698 |
| 7,474,538 | B2 * | 1/2009 | Kikuchi et al. | 361/780 |
| 2005/0139990 | A1* | 6/2005 | Kim | 257/704 |
| 2006/0043568 | A1* | 3/2006 | Abe et al. | 257/698 |
| 2006/0097407 | A1* | 5/2006 | Ito | 257/784 |
| 2006/0131065 | A1* | 6/2006 | Ohwaki | 174/252 |
| 2008/0136014 | A1* | 6/2008 | Huang | 257/700 |
| 2012/0013010 | A1* | 1/2012 | Kim | 257/753 |

* cited by examiner

*Primary Examiner* — David Zarneke
(74) *Attorney, Agent, or Firm* — Steven A. Shaw; W. James Brady; Frederick J. Telecky, Jr.

(57) ABSTRACT

A method for forming a packaged electronic device including a package substrate having a top substrate surface including a die attach region including at least one land pad thereon and a first dielectric layer positioned lateral to the land pad and a non-die attach region. A second dielectric layer is formed on the top substrate surface of the package substrate. An IC die which is mounted to the top substrate surface of the package substrate. An underfill layer is formed between the IC die and the die attach region.

14 Claims, 5 Drawing Sheets

US 8,298,874 B2

PACKAGED ELECTRONIC DEVICES HAVING DIE ATTACH REGIONS WITH SELECTIVE THIN DIELECTRIC LAYER

CROSS REFERENCE TO RELATED APPLICATIONS

This application is a Divisional of and claims priority to U.S. patent application Ser. No. 12/563,206 filed on Sep. 21, 2009 which claims the benefit of Provisional Application Ser. No. 61/182,134 entitled "SELECTIVE THIN SOLDER MASK UNDER DIE FOR IMPROVED UNDERFILLING", filed May 29, 2009. Said applications herein incorporated by reference in their entirety.

FIELD

Disclosed embodiments are related in general to the field of packaged electronic devices, and more specifically packaged electronic devices having thin underfill under the IC die.

BACKGROUND

Various methods are known for bonding an integrated circuit (IC) die to a package substrate, such as printed circuit board (PCB). The surface of the package substrate generally includes a solder mask material in areas outside the metal land pads. Solder mask over conventional copper traces prevents copper oxidation, masks against solder spreading around the solder joints, and provides enhanced adhesion to the later applied underfill that is generally injected under the IC die after the bonding process. During flip-chip (FC) packaging, the IC die is turned upside down to connect the active circuit comprising top of the IC die to the metal land pads on the package substrate surface. In contrast, when packaging IC die having through substrate vias (TSVs), the IC die is mounted active circuit comprising top side up to connect to the TSVs accessible from the bottom of the IC die to the land pads on the package substrate surface. In either case, the metallic joints formed generally include solder provided by at least one of the IC die and the package substrate. Following the mounting of the IC die, capillary underfill is generally used to fill the volume that is generally referred to as an "underfill gap" that is between the mounted IC die and the package substrate.

One packaging challenge is related to void-free underfilling, particularly when the height of the underfill gap is small (e.g., <20 μm). Narrow gaps challenge capillary underfill flow, and tend to produce underfill voids in tight areas concentrated primarily in the die attach region under the IC die near the center of the die. As known in the art, underfill voids can lead to reliability failures. For example, chip scale package (CSP)/package on package (POP) technologies can result in a very small underfill gap, for small pitched pads and particularly for stud collapse (e.g., Au) to the FC land pad on the package substrate during ultrasonic bonding. This issue can be even more challenging for Au-to-Au interconnect technology.

Another assembly concern during IC die mounting is that the IC die can hit the top of the solder mask in the die attach region lateral to land pads, and result in damage to the active circuitry on the top surface of the IC die. The IC die hitting the top of the solder mask can also result in laterally offsetting the joint, which is known to increase the resistance of the joint, and in extreme cases can result in open circuits.

SUMMARY

The Inventor has recognized that for proper IC die adhesion to the surface of a packaged substrate, a dielectric layer (e.g., solder mask) is generally needed for underfill adhesion to limit interfacial failures. However, such a dielectric layer under the IC die reduces the gap between the IC die and the package substrate, which as described above can result in underfilling problems and can cause the IC die to hit the top of the dielectric layer (e.g., solder mask) during die mounting.

A possible solution to solve these conflicting requirements is to thin the dielectric layer (e.g., solder mask) everywhere on the package substrate surface (e.g., to about 10-15 μm), since this would increase the height of the gap between the IC die and the workpiece surface as compared to a nominal dielectric layer (e.g., solder mask) thickness of about 20 μm. However, the Inventor has recognized that although a thin dielectric layer can help minimize the underfill gap problem, if the dielectric layer is too thin outside the die attach area, the dielectric layer (e.g., solder mask) may be unable to reliably hold conducting balls added by a customer lateral to the IC die to mount another device (e.g., to mount a memory device). Moreover, very thin dielectric layers (e.g., solder mask) outside the die attach region generally increase voiding, which can result in shorting adjacent conducting traces positioned on the surface of the package substrate.

Disclosed embodiments provide solutions to the above problems by providing a package substrate having a top substrate surface having a relative thin dielectric layer on the top substrate surface in the die attach region and a relatively thick dielectric layer in the non-die attach regions of the top substrate surface. Disclosed embodiments include a package substrate having a top substrate surface including a die attach region including at least one land pad thereon and a first dielectric layer positioned lateral to the land pad and a non-die attach region. The non-die attach region includes a second dielectric layer, wherein a thickness of the second dielectric layer is >a thickness of the first dielectric layer by at least 5 μm. An IC die having a top semiconductor surface including active circuitry and at least one bonding conductor is formed on the top semiconductor surface and a bottom surface, wherein the bonding conductor of the IC die is coupled to the land pad of the package substrate. An underfill layer is positioned between the top semiconductor surface of the IC die and the die attach region.

Disclosed embodiments are also helpful for packaged electronic devices other than those assembled using capillary underfill, since reducing the dielectric (e.g., solder mask) height under the IC die reduces the mold cap height and thus brings the package profile down. For example, disclosed embodiments include thermal compression bonding (TCB).

DETAILED DESCRIPTION

Figure 1:
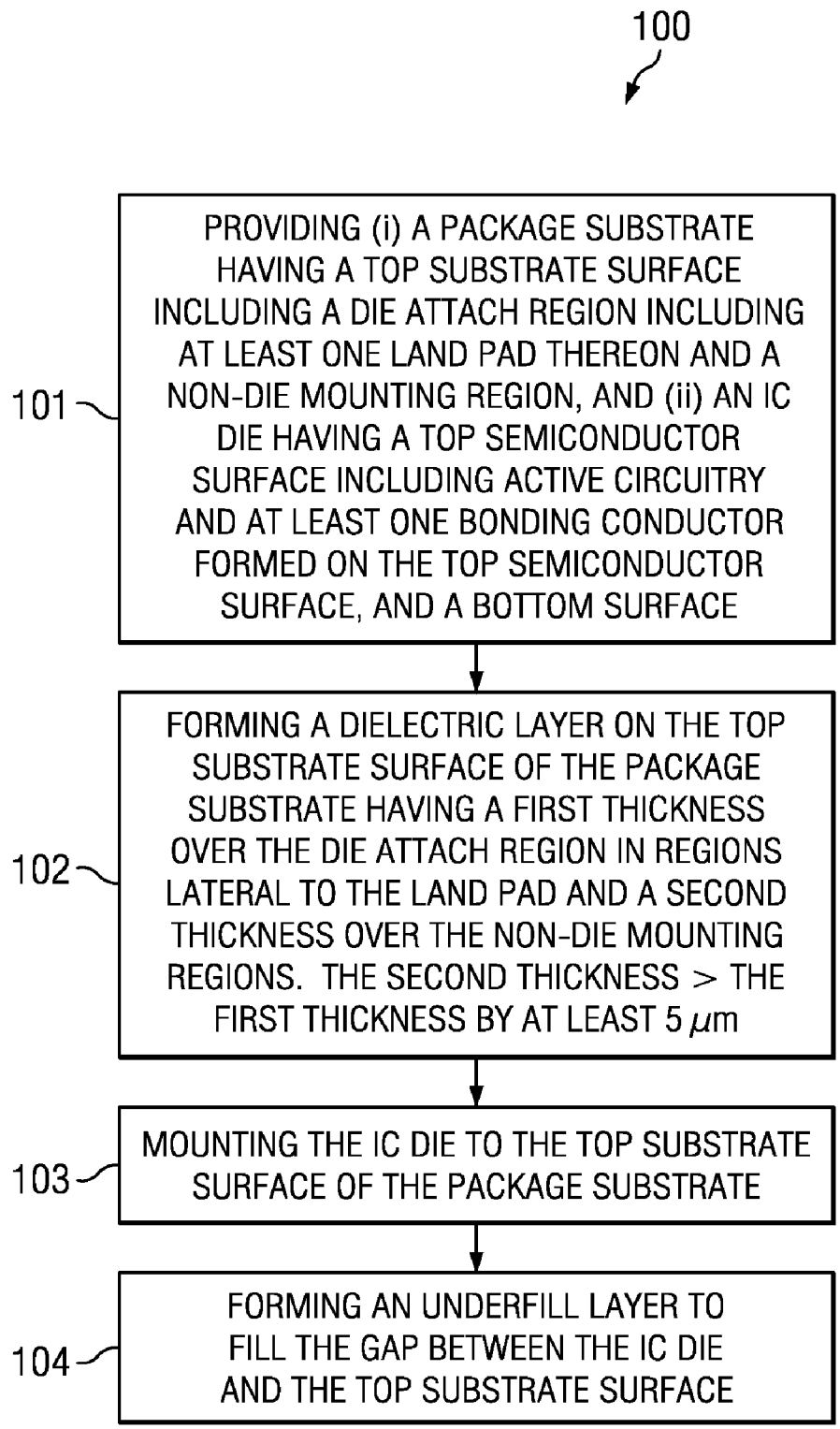
FIG. 1 shows steps in an exemplary method of forming packaged electronic devices using package substrates having differential dielectric thicknesses across its top surface with a thin dielectric in the die attach region and a thicker dielectric outside the die attach area, according to an embodiment of the invention.

Disclosed embodiments are described with reference to the attached figures, wherein like reference numerals are used throughout the figures to designate similar or equivalent elements. The figures are not drawn to scale and they are provided merely to illustrate the disclosed embodiments. Several disclosed aspects are described below with reference to example applications for illustration. It should be understood that numerous specific details, relationships, and methods are set forth to provide a full understanding of the disclosed embodiments. One having ordinary skill in the relevant art, however, will readily recognize that embodiments of the invention can be practiced without one or more of the specific details or with other methods. In other instances, well-known structures or operations are not shown in detail to avoid obscuring the disclosure. The disclosed embodiments are not limited by the illustrated ordering of acts or events, as some acts may occur in different orders and/or concurrently with other acts or events. Furthermore, not all illustrated acts or events are required to implement a methodology in accordance with embodiments of the invention.

FIG. 1 show steps in an exemplary method 100 of forming packaged electronic devices using package substrates having differential (e.g., two-tone) dielectric thicknesses across its top surface. Step 101 comprises providing (i) a package substrate (e.g., PCB) having a top substrate surface including a die attach region including at least one land pad thereon and a non-die mounting region, and (ii) an IC die having a top semiconductor surface including active circuitry and at least one bonding conductor formed on the top semiconductor surface, and a bottom surface. The active circuitry formed on the semiconductor top surface comprises circuit elements that generally include transistors, diodes, capacitors, and resistors, as well as signal lines and other conductors that interconnect these various circuit elements.

Step 102 comprises forming a dielectric layer on the top substrate surface of the package substrate having a first thickness over the die attach region in regions lateral to land pad and a second thickness over the non-die mounting regions. The second thickness>the first thickness by at least 5 µm. In typical embodiments, the first dielectric is ≦10 µm thick.

The dielectric layer is generally at least one of abalatable and photo-imageable, and also provides good adhesion to both the surface of the package substrate (e.g., polymer substrate such as a polyimide or a ceramic substrate) and underfill materials. The dielectric layer can be a polymer, such as a solder mask material. Solder mask materials may include photosensitive acrylate and methacrylate type solder mask materials, and epoxy based solder masks. The solder mask material can be liquid or a dry film. When a liquid, it can be sprayed or screened onto the carrier.

There are a variety of methods for obtaining differential dielectric thicknesses on the top substrate surface of said package substrate. A first exemplary embodiment comprises a double pass dielectric process to provide a two-tone dielectric thickness. The thicker or thinner dielectric (e.g., thinner dielectric in the die attach regions) is applied (e.g., screen printing or spray coating) and is then defined, such as using photo imaging. The other of the thicker or thinner dielectric (e.g., thicker dielectric outside the die attach regions) is formed in the second pass by application (screen printing or spray coating) and then definition, again using processing such as photo imaging.

A second exemplary embodiment comprises a laser ablation process. In a typical ablation process, the thicker dielectric intended for the non-die attach regions will be applied to both the die attach regions and the non-die attach regions. Using alignment techniques such as based on fiducial references, laser ablation is performed in the die attach regions to remove at least 5 µm of the dielectric thickness, while leaving the dielectric thickness in the non-die attach regions generally unchanged.

Step 103 comprises mounting the IC die to the top substrate surface of the package substrate. The die can be mounted face-up (e.g., for TSV comprising die or for wire bonding applications) or face down/FC (e.g., for ICs having pillars or conventional bond pads). If the bonding conductor of the IC die (e.g., bump, pillar or TSV tip) comprise gold or are coated with gold, and there is also gold on the land pads of the package substrate (e.g., gold or nickel/gold), solder is generally not needed for the joint. In other embodiments, solder is generally provided on at least one of the bonding conductor of the IC (e.g., bump, pillar or TSV) and the land pads of the package substrate Step 104 comprises forming an underfill layer to fill a gap between the IC die and the top substrate surface. In one embodiment, the underfill is applied by a capillary underfill process.

As noted above, disclosed embodiments are also helpful beyond capillary underfill applications, since reducing the dielectric height under the IC die reduces the mold cap height and thus brings the package profile down. In an alternate embodiment, step 103/104 (mounting and underfilling) are performed using a TCB process. In this embodiment, a curable dielectric film (CDF) that is tacky is placed between the IC die and the package substrate. In one embodiment, the CDF material prior to curing provides a low melt viscosity, such as lower than 500 to 1,000 pascal-second (Pa·s), and fast curability, such as a 30 second cure time for a temperature of at least 180° C. The CDF can include an optional filler, with the wt. % of the filler in one embodiment based on matching the coefficient of thermal expansion (CTE) of the CDF to the CTE of the lamination area surface (i.e. substrate top surface). The thickness of the CDF is generally calculated to fill nominal underfill gap area with an additional thickness amount to reflect a manufacturability margin. For example, if the underfill gap is 10 µm, the thickness of the CDF is 15 to 20 µm. The CDF material can include flux. As known in the art, a flux refers to a chemically- or physically-active formulation capable of cleaning oxides and enabling wetting of metals (e.g., copper) with solder. Flux is generally included in the CDF when the bonding conductors include highly oxidizable metals, such as copper. Metallic joints are not formed at this step.

In this alternate embodiment, after placing, the IC die and package substrate is heat pressed together to mount the IC die on the package substrate, using a pressing force (pressure) to result in the bonding conductors of the IC die penetrating into the CDF layer to form metallic joints between the bonding conductors and the land pads of the package substrate, while the heat is sufficient to result in the CDF forming an underfill layer (e.g., cross-linking) Typical heat pressing conditions can comprise a temperature of 150-180° C., force/area (pressure) during pressing of 35-133 Kgf/cm$^2$, and a pressing time between 100-180 sec. Accordingly, in this embodiment conventional capillary underfill is unnecessary.

Figure 2A:
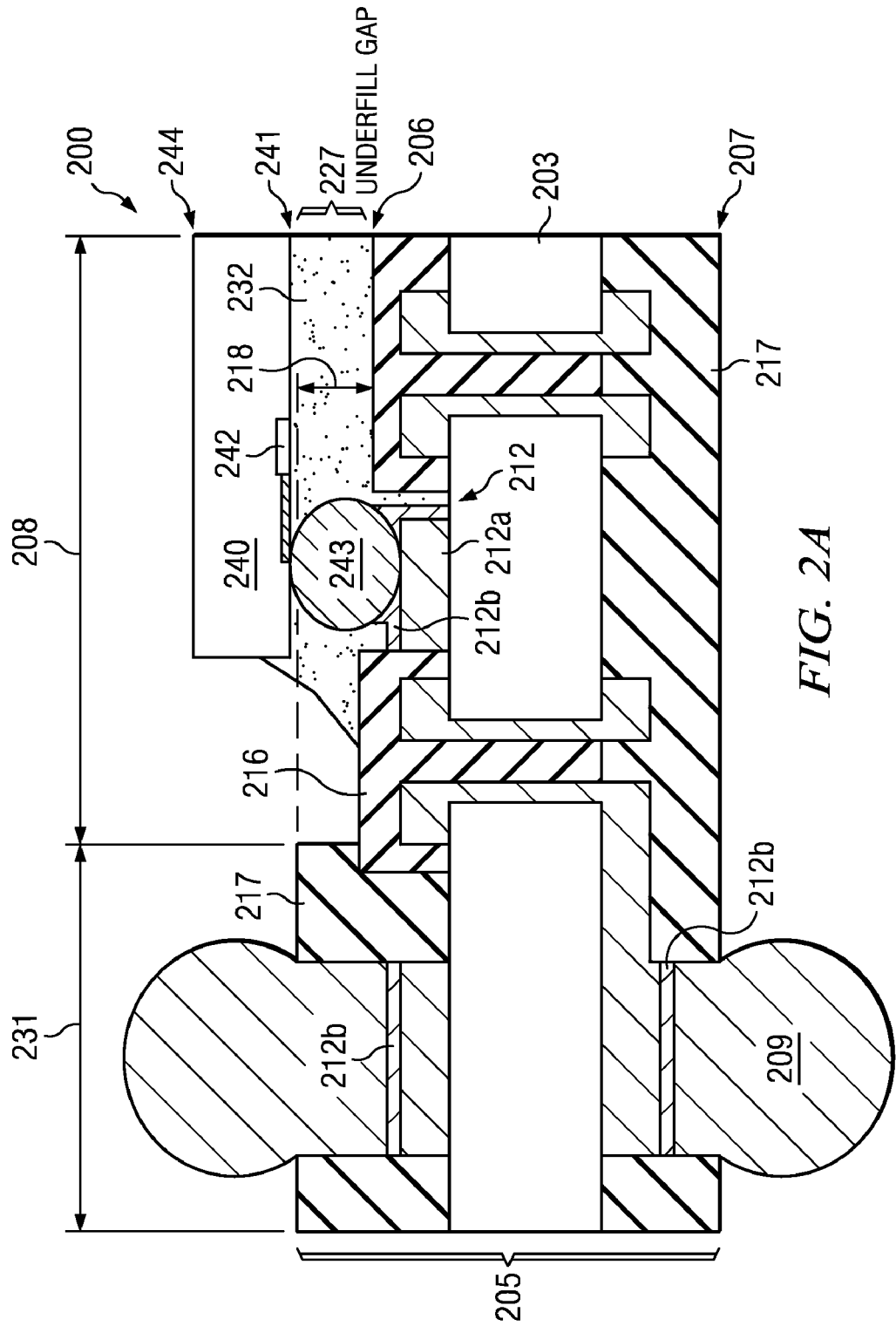
FIG. 2A is a simplified cross sectional depiction of a FC assembled packaged electronic device including a package substrate having differential dielectric thicknesses across its top surface with a thin dielectric in the die attach region and a thicker dielectric outside the die attach area, according to an embodiment of the invention.

FIG. 2A is a simplified cross sectional depiction of an FC assembled packaged electronic device 200 including a package substrate having a differential dielectric thicknesses across its top surface with a thin dielectric in the die attach region and a thicker dielectric outside the die attach area, according to an embodiment of the invention. Device 200 comprises a package substrate 205 having a top substrate surface 206 including a die attach region 208 including at least one land pad 212 thereon and a first dielectric layer 216 positioned lateral to the land pad 212 and a non-die attach region 231. Die attach region 208 generally extends laterally beyond the area of the IC die 240 from about 200 μm to 1 mm.

The land pad 212 is shown having a bottom pad portion (e.g., copper) 212(a) with a top pad portion 212(b) that can comprise a noble metal such as nickel-gold or gold. The package substrate 205 comprises a board substrate material (e.g., polymer or ceramic) 203 and includes a bottom substrate surface 207. A ball 209 is shown on the bottom substrate surface 207 to evidence one element of a ball grid array configuration for package substrate 205.

The non-die attach region 231 includes a second dielectric layer 217, wherein the thickness of the second dielectric layer 217 is >a thickness of the first dielectric layer 216 by at least 5 μm, shown as thickness delta 218. In one embodiment, the second dielectric layer 217 is ≧15 μm thick and the first dielectric layer 216 is ≦10 μm thick. As described above, the first and second dielectric layers can both comprise solder mask, or other suitable dielectric.

The IC die 240 has top semiconductor surface including active circuitry 242 and at least one bonding conductor 243 shown as a collapsed stud bump (e.g., gold comprising, such a gold stud bump) formed on the top semiconductor surface 241. IC die 240 also includes a bottom surface 244. The bonding conductor 243 of the IC die 240 is joined to the land pad 212 of the package substrate 205. In the embodiment the top pad portion 212(b) comprises gold (e.g., gold stud bump) and the land pads 212 of the package substrate 205 include a gold surface layer the bonding comprises gold-to-gold bonding, and as known in the art the collapse of the gold stud bump results in the height of the underfill gap located between said IC die 240 and the die attach region 208 shown as 227 being particularly small. An underfill layer 232 fills the underfill gap 227.

Figure 2B:
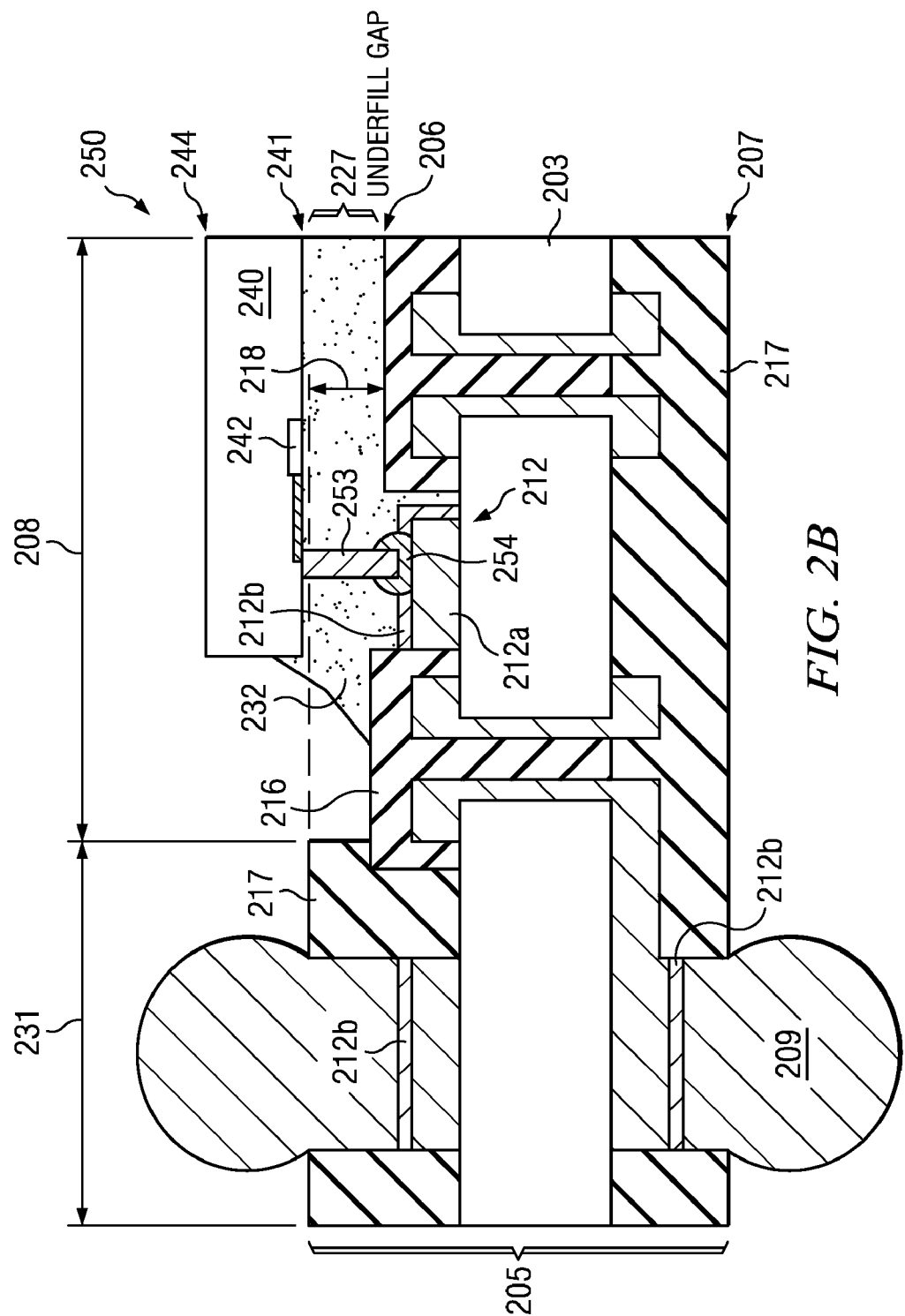
FIG. 2B is a simplified cross sectional depiction of a FC assembled packaged electronic device including a package substrate having differential dielectric thicknesses across its top surface with a thin dielectric in the die attach region and a thicker dielectric outside the die attach area, wherein the IC die includes bonding conductors comprising pillars or coined studs, according to an embodiment of the invention.

FIG. 2B is a simplified cross sectional depiction of an FC assembled packaged electronic device 250 including a package substrate having differential dielectric thicknesses across its top surface with a thin dielectric in the die attach region and a thicker dielectric outside the die attach area, according to an embodiment of the invention. Device 250 is analogous to device 200 shown in FIG. 2A, except bonding conductor 243 shown as a bump in FIG. 2A, is now shown as a pillar 253, such as a copper pillar. Solder 254 is shown between pillar 253 and land pad 212. As known in the art, prior to bonding to form packaged electronic device 250, solder 254 can be provided on the surface of land pad 212, the surface of pillar 253, or both of these surfaces.

Figure 3A:
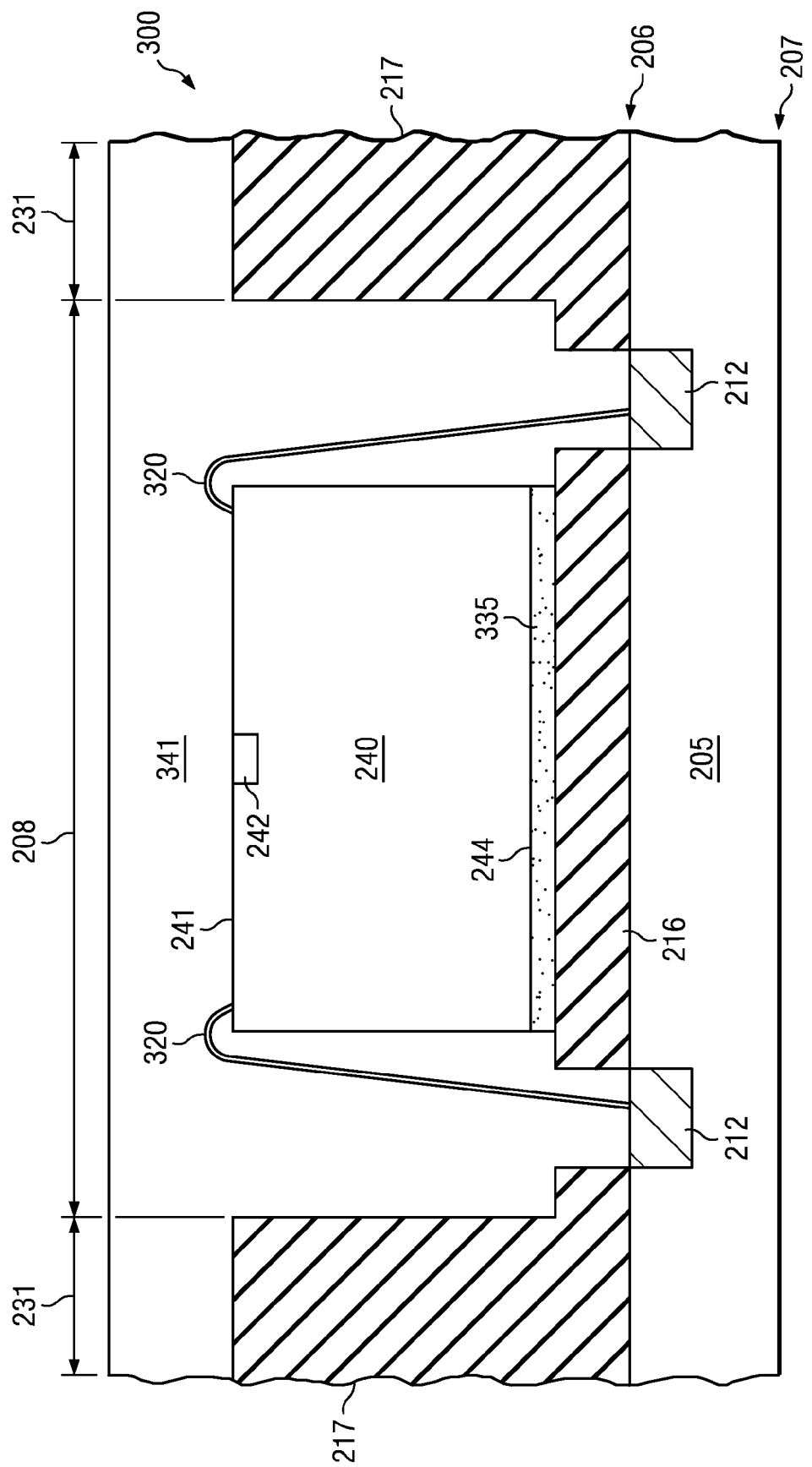
FIG. 3A is a simplified cross sectional depiction of a face-up assembled packaged electronic device including a package substrate having differential dielectric thicknesses across its top surface with a thin dielectric in the die attach region and a thicker dielectric outside the die attach area, that includes bond wires for coupling the IC die to the package substrate, according to an embodiment of the invention.

Although FIGS. 2A and 2B show FC assemblies, as described above embodiments of the invention also include face-up die assemblies where the top semiconductor surface of the IC die is bonded with its top semiconductor surface including active circuitry facing away from the top substrate surface of the package substrate. FIG. 3A is a simplified cross sectional depiction of a face-up assembled packaged electronic device 300 including a package substrate 205 having differential dielectric thicknesses across its top surface with a thin dielectric 216 in the die attach region 208 and a thicker dielectric 217 outside the die attach area, according to an embodiment of the invention. Bond wires 320 couple the IC die 240 to the package substrate 205. IC die is bonded to thin dielectric layer 216 in the die attach region by an adhesive 335. A mold material 341 encapsulates IC die 240.

Figure 3B:
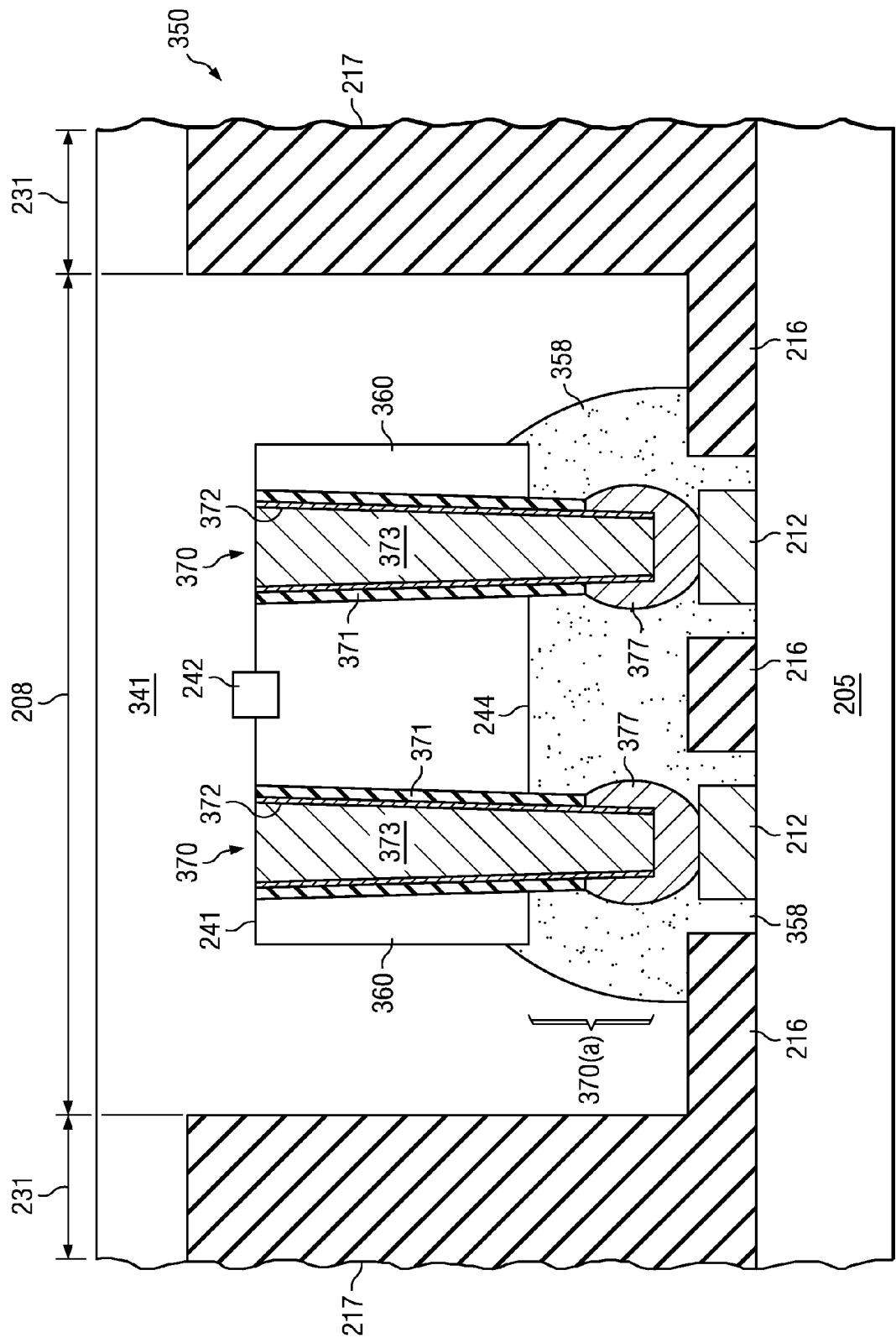
FIG. 3B is a simplified cross sectional depiction of a face-up assembled packaged electronic device including a package substrate having differential dielectric thicknesses across its top surface with a thin dielectric in the die attach region and a thicker dielectric outside the die attach area, wherein the IC die includes through substrate vias (TSVs) for coupling the IC die to the package substrate, according to an embodiment of the invention.

FIG. 3B is a simplified cross sectional depiction of a face-up assembled packaged electronic device 350 including a package substrate 205 having differential dielectric thicknesses across its top surface with a thin dielectric 216 in the die attach region 208 and a thicker dielectric 217 outside the die attach region 231, wherein the IC die 360 includes TSVs 370 for coupling the IC die to the package substrate, according to an embodiment of the invention.

TSVs 370 extend from one of the metal interconnect layers (not shown) formed on the top semiconductor surface 241 to the bottom surface 244 of IC die 360 and include a protruding TSV tip portion 370(a). The distal portion of TSV tips 370(a) are shown covered with solder 377 to form solder mediated joints with land pads 212 of package substrate 205.

TSVs 370 are shown comprising an outer dielectric liner 371, a diffusion barrier layer 372 inside the dielectric liner, and an electrically conductive TSV filler 373 comprising a material such as copper, tungsten or heavily doped polysilicon inside the diffusion barrier layer 372. As known in the art, when the TSV filler material comprises a material that is not a lifetime killer (e.g., polysilicon) or is not a fast diffuser in the semiconductor (e.g., tungsten), the diffusion barrier layer 372 is not generally needed. Underfill is shown as 358, such as formed from a CDF in a TCB assembly process.

Embodiments of the invention can be integrated into a variety of process flows to form a variety of devices and related products. The semiconductor substrates may include various elements therein and/or layers thereon. These can include barrier layers, other dielectric layers, device structures, active elements and passive elements including source regions, drain regions, bit lines, bases, emitters, collectors, conductive lines, conductive vias, etc. Moreover, embodiments of the invention can be used in a variety of processes including bipolar, CMOS, BiCMOS and MEMS.

While various embodiments of the invention have been described above, it should be understood that they have been presented by way of example only, and not limitation. Numerous changes to the disclosed embodiments can be made in accordance with the disclosure herein without departing from the spirit or scope of the disclosed embodiments. Thus, the breadth and scope of embodiments of the invention should not be limited by any of the above explicitly described embodiments. Rather, the scope of the invention should be defined in accordance with the following claims and their equivalents.

Although the embodiments of the invention have been illustrated and described with respect to one or more implementations, equivalent alterations and modifications will occur to others skilled in the art upon the reading and understanding of this specification and the annexed drawings. In addition, while a particular feature may have been disclosed with respect to only one of several implementations, such a feature may be combined with one or more other features of the other implementations as may be desired and advantageous for any given or particular application.

The terminology used herein is for the purpose of describing particular embodiments only and is not intended to be limiting to embodiments of the invention. As used herein, the singular forms "a," "an," and "the" are intended to include the plural forms as well, unless the context clearly indicates otherwise. Furthermore, to the extent that the terms "including," "includes," "having," "has," "with," or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which embodiments of the invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the following claims.

The invention claimed is:

1. A method of forming a packaged electronic device, comprising:
providing (i) a package substrate having top substrate surface including a die attach region including at least one land pad thereon and a non-die mounting region and (ii) an IC die having a top semiconductor surface including active circuitry and at least one bonding conductor formed on said top semiconductor surface and a bottom surface;
forming a dielectric layer on said top substrate surface of said package substrate having a first thickness over said die attach region in regions lateral to said land pad and a second thickness over said non-die mounting region, wherein said second thickness>said first thickness by at least 5 μm, and
mounting said IC die to said top substrate surface of said package substrate, and
forming an underfill layer to fill a gap between said IC die and said top substrate surface.

2. The method of claim 1, wherein said forming comprises:
applying a first dielectric layer having said first thickness;
patterning said first dielectric layer to localize said first dielectric layer over said die attach region in regions lateral to said land pad;
applying a second dielectric layer having said second thickness, and
patterning said second dielectric layer to localize said second dielectric layer over said non-die mounting region.

3. The method of claim 1, wherein said forming comprises:
depositing said dielectric layer having said second thickness, and
laser ablating said dielectric layer to selectively thin said second thickness of said dielectric layer to said first thickness over said die attach region in regions lateral to said land pad.

4. The method of claim 1, further comprising positioning a curable dielectric film (CDF) between said top substrate surface of said package substrate and said top semiconductor surface or said bottom surface of said IC die, and wherein said forming said underfill layer comprises heat pressing said CDF so that said bonding conductor penetrates into said CDF layer to form a metallic joint with said land pad.

5. The method of claim 1, wherein said mounting said IC die comprises joining said IC die to said top substrate surface, and said forming said underfill layer comprises underfilling with an underfill material to fill said gap.

6. The method of claim 1, wherein said mounting comprises bonding said IC die with said top semiconductor surface of said IC die facing said top substrate surface of said package substrate.

7. The method of claim 6, wherein said bonding conductor of said IC die comprises a copper pillar.

8. The method of claim 1, wherein said mounting comprises forming a metallic joint between said bonding conductor and said land pad.

9. The method of claim 8, wherein said metallic joint comprises a gold-to-gold comprising joint.

10. The method of claim 1, wherein said IC die is bonded with said top semiconductor surface of said IC die facing away from said top substrate surface of said package substrate.

11. The method of claim 1, wherein said bonding conductor of said IC die comprises a through substrate via (TSV) including a protruding TSV tip that protrudes from said bottom surface of said IC die.

12. The method of claim 1, further comprising attaching a bond wire for coupling said bonding conductor of said IC die to said land pad of said package substrate after said mounting.

13. The method of claim 1, wherein said first and said second dielectric layer both comprise solder mask.

14. The method of claim 1, further comprising dropping a metal ball on said land pad of said package substrate before said mounting.

* * * * *